United States Patent [19]
Lee

[11] Patent Number: 5,866,458
[45] Date of Patent: *Feb. 2, 1999

[54] METHOD FOR FABRICATING A CMOS

[75] Inventor: Chang Jae Lee, Cheongju-si, Rep. of Korea

[73] Assignee: LG Semicon Co., Ltd., Chungcheongbuk-Do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 520,440

[22] Filed: Aug. 29, 1995

[51] Int. Cl.$^6$ .......................... H01L 21/8238; H01L 21/82
[52] U.S. Cl. ........................... 438/277; 438/199; 438/237
[58] Field of Search .................................... 438/277, 199, 438/237

[56] References Cited

U.S. PATENT DOCUMENTS

| | | | |
|---|---|---|---|
| 5,208,473 | 5/1993 | Komori et al. | 257/345 |
| 5,292,671 | 3/1994 | Odanaka | 437/29 |

*Primary Examiner*—Susan A. Loring
*Attorney, Agent, or Firm*—Morgan, Lewis & Bockius LLP

[57] ABSTRACT

A CMOS fabrication method includes the steps of providing a substrate having a surface, forming a first conductive well adjacent to the surface of the substrate, forming a second conductive well adjacent to the surface of the substrate, a portion of the first conductive well overlapping a portion of the second conductive well, forming a field oxide in the overlapping portion of the first and second conductive wells forming a first gate over the first conductive well and a second gate over the second conductive well, masking the first conductive well and implanting second conductive impurities on the second conductive well and masking the second conductive well and implanting first conductive impurities on the first conductive well.

20 Claims, 11 Drawing Sheets

METHOD FOR FABRICATING A CMOS

BACKGROUND OF THE INVENTION

1. Field of the Invention

The present invention relates to a method for fabricating a CMOS, and more particularly, to a method for fabricating a CMOS using ion implantation processes.

2. Discussion of the Related Art

A scaled-down CMOS device has several drawbacks such as punch-through between the source and drain in a short channel MOSFET, latch-up in a CMOS circuit, and degradation of insulation characteristics due to the punch-through between devices. These problems need to be solved to attain a successful scaled-down semiconductor CMOS device. One proposed solution to these problems involves a method of performing a punch-through-stop-ion implantation on a semiconductor substrate before forming a gate electrode in order to improve the punch-through characteristics of a short channel MOSFET. Also, in order to solve the latch-up problem, a retrograde well doping method is performed using a high energy ion implantation. A field channel stop doping method is performed before forming a field oxide in order to improve insulation characteristics.

However, the above proposed solutions require many trade-offs in fabricating CMOS integrated circuits such as complicated fabrication including many ion implantation steps, increased fabrication costs, degradation in characteristics due to the increase in concentration of MOSFET channel regions by a punch-through doping step, reduced speed due to reduced carrier mobility and increased junction capacitance, reduced active width due to dopant encroachment from a field region to an active region by a field transistor channel stop doping step, and increased threshold voltage of the transistor. Therefore, research has been needed to reduce fabrication costs and to prevent degradation of device characteristics in scaled down semiconductor devices.

A conventional CMOS fabrication method will now be described with reference to the accompanying drawings.

Referring to FIG. A, a first insulation layer 112 made of $SiO_2$ is formed on a substrate 111, and a second insulation layer 113 made of silicon nitride ($Si_3N_4$) is formed on first insulation layer 112.

Referring to FIG. 1B, second insulation layer 113 ($Si_3N_4$) of a potential n-well portion is removed, and a photoresist 114 is deposited on second insulation layer 113 ($Si_3N_4$) at the portion excluding the potential n-well portion. $P^+$ ions are implanted to form an n-well 116, as shown in FIG. 1C.

First insulation layer 112 ($SiO_2$) is cultivated to form a field oxide 115, and n-well 116 is cultivated. Boron ($B^+$) ions are implanted over the structure in order to form a p-well 117 under first insulation layer 112 ($SiO_2$) with the potential n-well 116 remaining, as shown in FIG. 1C. P-well 117 is formed on the portion of the substrate 111 excluding the cultivated thick portion of field oxide 115.

Referring to FIG. 1D, field oxide 115 is partially removed to make the thickness thereof same as that of first insulation layer 112, thereby re-forming first insulation layer 112 on wells 116 and 117.

Referring to FIG. 1E, a second photoresist 118 is deposited above the middle portion of P-well 117 and above n-well 116. Phosphorus ions ($P^+$) are implanted into n-well 116 to perform a field channel stop ion implantation forming $N^+$ regions 119.

Referring to FIG. 1F, a third photoresist 121 is deposited above the whole surface of p-well 117 and middle portion of n-well 116, and boron ions ($B^+$) are implanted to perform a field channel stop ion implantation forming $p^+$ regions 120.

Referring to FIG. 1G, a fourth photoresist 122 is deposited above n-well 116 and boron fluoride $BF_2$ is implanted into p-well 117 to perform a threshold voltage controlling ion implantation.

Fourth photoresist 122 deposited above n-well 116 is removed, a fifth photoresist 123 is deposited above p-well 117, and boron fluoride $BF_2$ is implanted into n-well 116 for performing the threshold voltage controlling ion implantation, as shown in FIG. 1H. Fifth photoresist 123 is removed to complete the threshold voltage controlling ion implantation processes for n-well 116 and p-well 117, as shown in FIG. 1I.

In order to form a gate for n-well 116, an $n^+$ polysilicon layer 124 is formed on field oxides 115 and initial oxides 112 and a gate oxide layer 125 is formed on $n^+$ polysilicon layer 124. A sixth photoresist 126 is selectively deposited on a part of gate oxide layer 125 where the MOSFET gate will later be formed, as shown in FIG. 1J.

Gate oxide 125 and $n^+$ polysilicon layer 124 are etched, excluding the portions underneath sixth photoresist 126. Sixth photoresist 126 is removed to complete a p-MOSFET gate above a middle portion of n-well 116, as shown in FIG. 1K.

In order to form a gate of an MOSFET, a $p^+$ polysilicon layer 127 is deposited on field oxides 115 and initial oxides 112 and a gate oxide layer 128 is formed on $p^+$ polysilicon layer 127. A seventh photoresist 129 is selectively deposited above a middle portion of p-well 117, as shown in FIG. 1L.

Seventh photoresist 129 is etched excluding the lower portion thereof to leave $p^+$ polysilicon layer 130 and gate oxide layer 131, thereby completing an n-MOSFET gate, as shown in FIG. 1M.

In order to form a source 132 and a drain 133 of the p-MOS, an eighth photoresist 134 is deposited on p-well 117, as shown in FIG. 1N. Referring to FIG. 1N, boron ions ($B^+$) are implanted over n-well 116 to form $p^+$ source 132 and drain 133 between field oxides 115 of n-well 116 and gate 124.

Referring to FIG. 1O, a ninth photoresist 137 is deposited on n-well 116. Phosphorus ions ($P^+$) are implanted over p-well 117 to form $n^+$ MOS source 135 and drain 136 between field oxides of p-well 117 and gate 130.

Ninth photoresist 137 is removed to finally complete the conventional CMOS, as shown in FIG. 1P.

FIG. 2 is a cross-sectional view of a conventional MOSFET for explaining the punch-through phenomenon. In FIG. 2, if a voltage is applied between source 140 and drain 141 and is gradually increased, of junctions between source 140 and drain 141 and between wells, the width of depletion regions 142 of the junction well is increased. Particularly, the depletion increase becomes maximum at the portion not having the effect of the voltage reaching from a gate to a substrate and the corner of the source/drain junction where electric fields are concentrated. If the depletion regions of source 140 and drain 141 are interconnected, carriers may rapidly move from source 140 to drain 141 through the depletion layer. Thus, if the punch-through phenomenon of an MOSFET occurs within an operating voltage, the MOSFET will become defective.

As described above, according to the conventional technique, if the concentration of wells is increased or a punch-through-stop-ion implantation is performed in order to eliminate the punch-through of the scaled-down device, the concentration of undesired MOSFET channel regions is increased, thereby reducing the speed, mobility and junction capacitance characteristics of the MOSFET. If a channel stop doping process is performed before forming a field oxide layer between active regions of an MOSFET, the space of the active regions will be reduced, thereby decreasing a current driving concentration of the MOSFET.

Moreover, the conventional method involves many complicated ion implantation processes such as a punch-through-stop-ion implantation and field channel stop implantation of an active device, a threshold voltage implantation of an MOSFET, and a retrograde implantation for improving a latch-up. Accordingly, the fabrication cost is considerably increased.

SUMMARY OF THE INVENTION

The present invention has been made in view of the above circumstances and has as an object to provide a CMOS fabricating method whereby an ion implantation for controlling a threshold voltage, an ion implantation for improving punch-through and latch-up characteristics of a device, and a field channel stop ion implantation for improving insulation characteristics between devices, are performed at the same time.

Another object of the present invention is to set an optimum dosage and accelerating energy to perform an ion implantation process and improve CMOS characteristics.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects in accordance with the purpose of the invention, as embodied and broadly described herein, the CMOS fabrication method of this invention comprises the steps of providing a substrate having a surface, forming a first conductive well adjacent to the surface of the substrate, forming a second conductive well adjacent to the surface of the substrate, a portion of the first conductive well overlapping a portion of the second conductive well, forming a field oxide in the overlapping portion of the first and second conductive wells forming a first gate over the first conductive well and a second gate over the second conductive well, masking the first conductive well and implanting second conductive impurities on the second conductive well and masking the second conductive well and implanting first conductive impurities on the first conductive well.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings.

DETAILED DESCRIPTION OF THE PREFERRED EMBODIMENTS

Figure 1A:
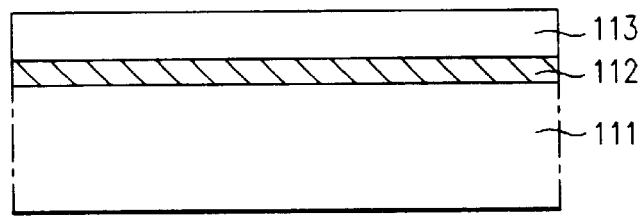
FIGS. 1A through 1P are cross-sectional views of a CMOS illustrating conventional fabrication processes.
Figure 1B:
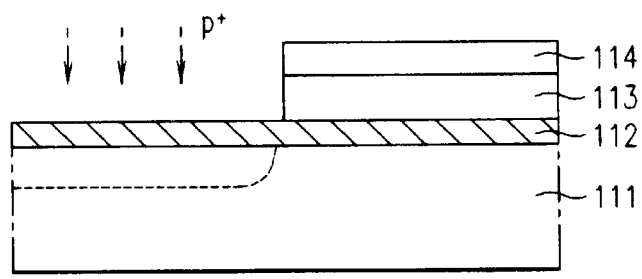
Figure 1C:
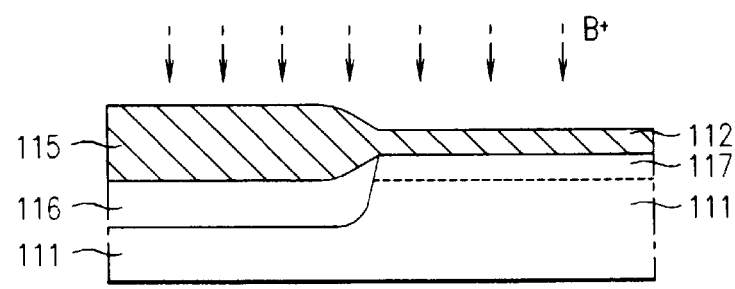
Figure 1D:
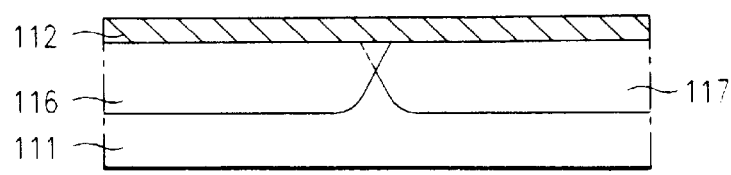
Figure 1E:
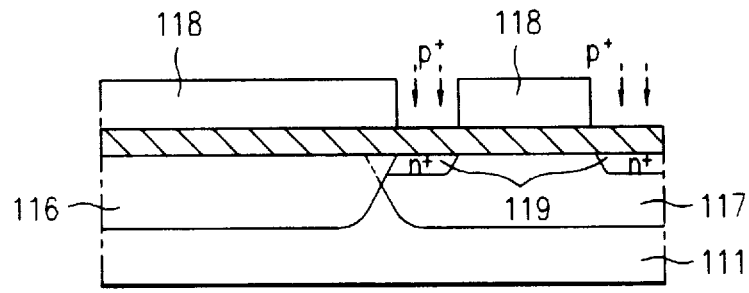
Figure 1F:
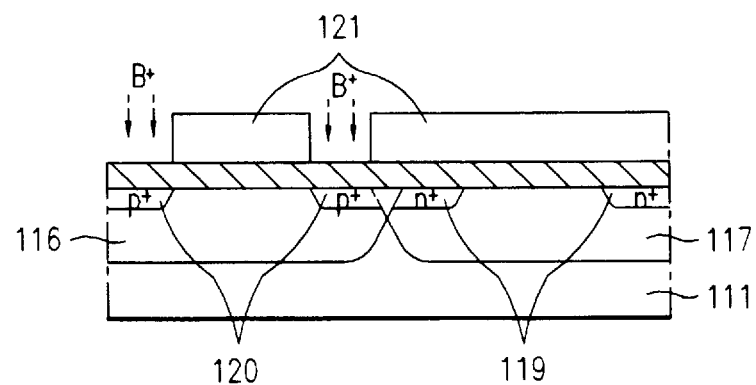
Figure 1G:
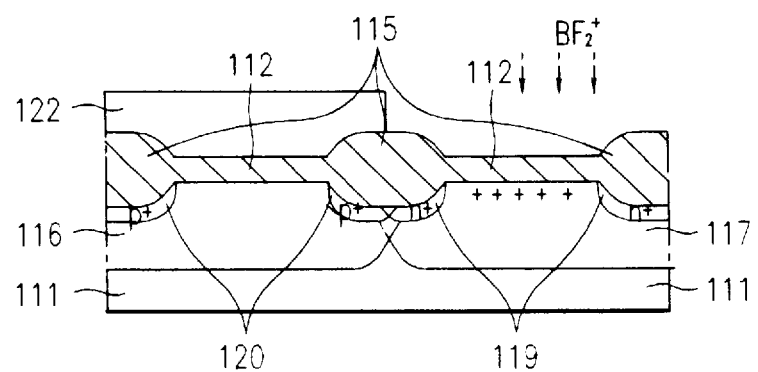
Figure 1H:
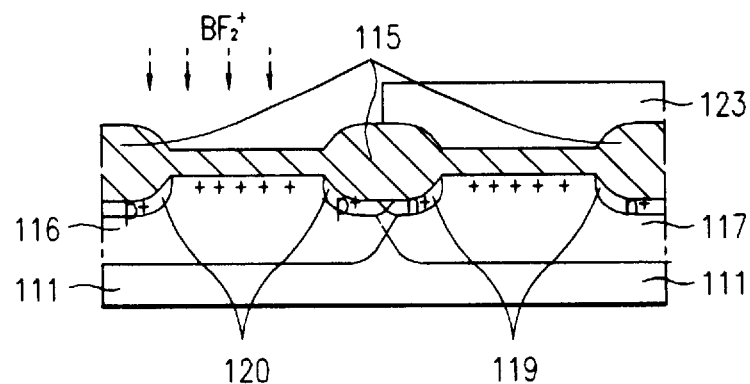
Figure 1I:
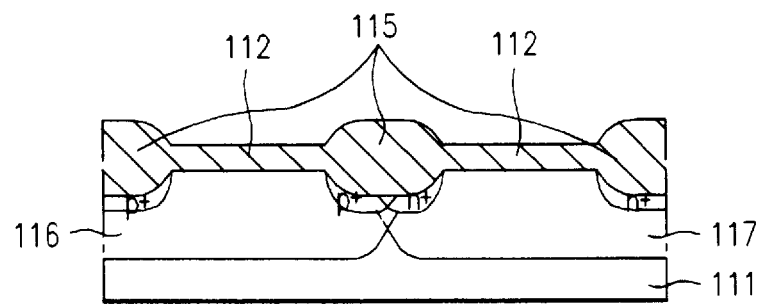
Figure 1J:
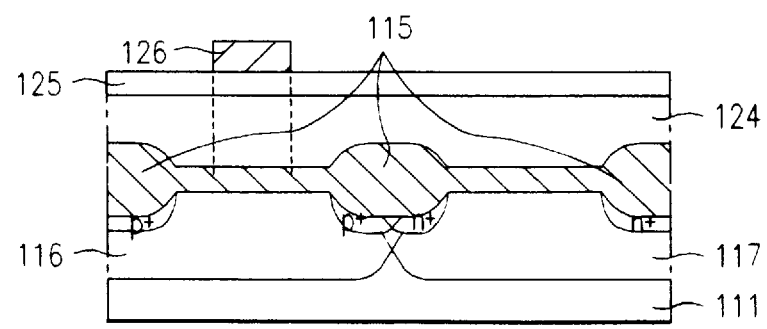
Figure 1K:
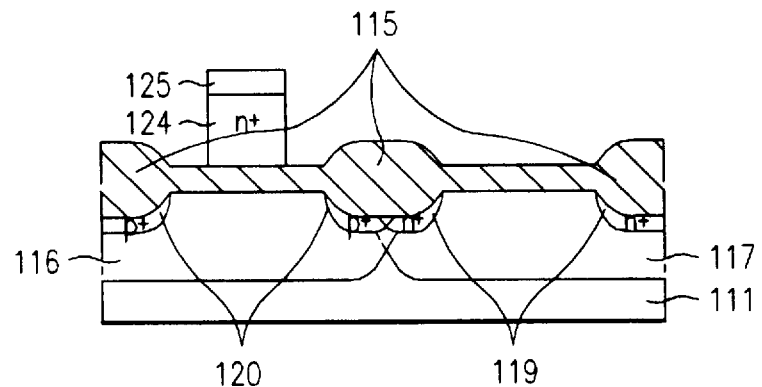
Figure 1L:
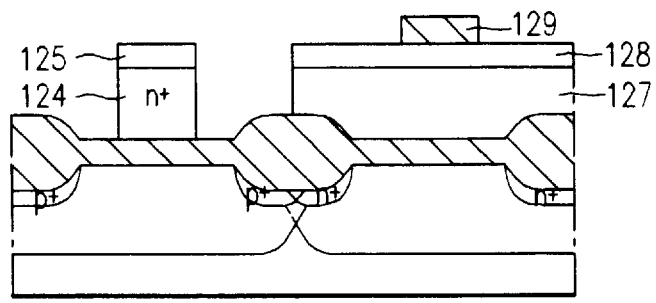
Figure 1M:
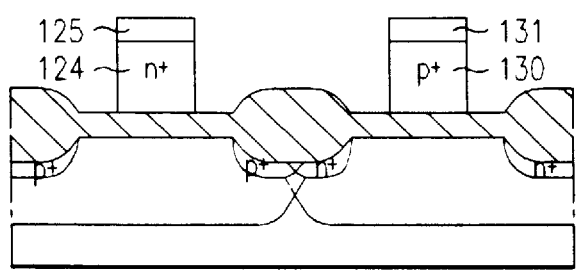
Figure 1N:
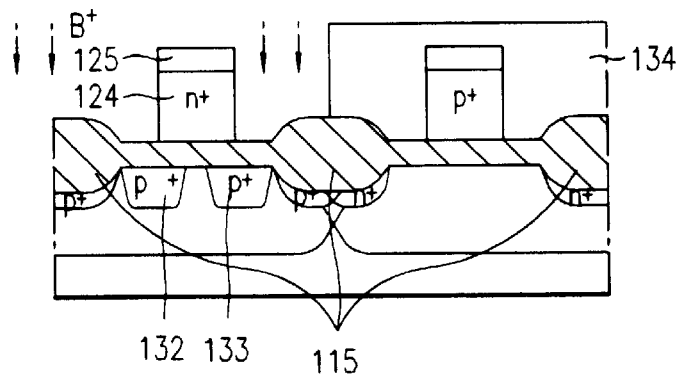
Figure 1O:
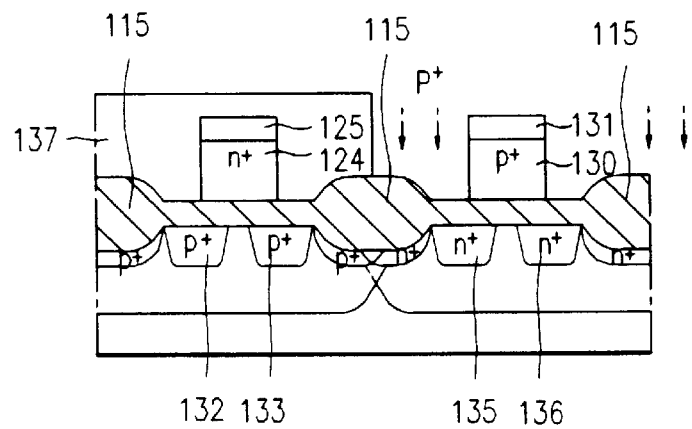
Figure 1P:
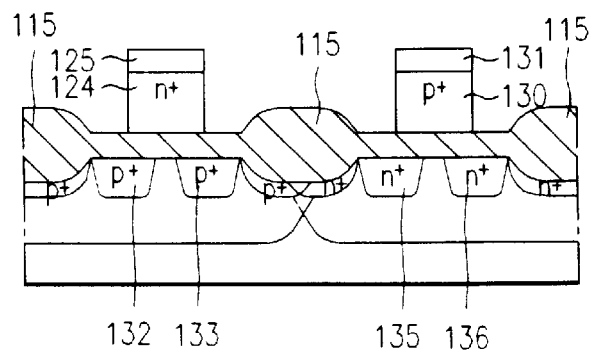
Figure 2:
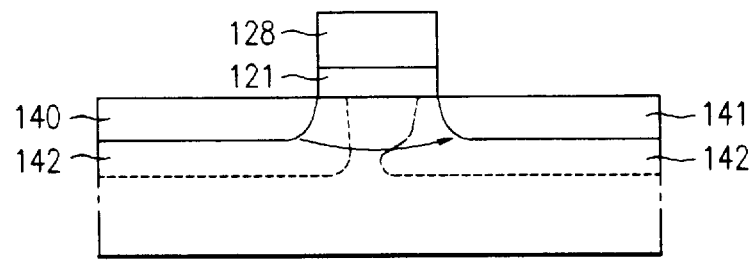
FIG. 2 is a cross-sectional view of a CMOS illustrating a punch-through phenomenon.
Figure 3A:
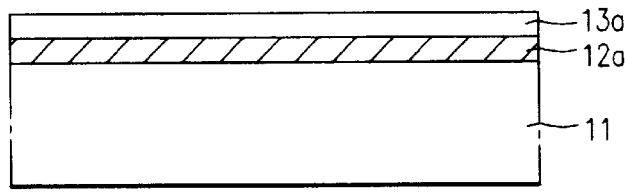
FIGS. 3A through 3M are cross-sectional views of a CMOS illustrating the fabrication steps according to the present invention.

Referring to FIG. 3A, a silicon oxide layer 12a is cultivated on a silicon substrate 11 to a thickness of 100 Å using anode oxidation, vacuum deposition of $SiO_2$, sputtering, and plasma processes. Also, silicon nitride layer ($Si_3N_4$) 13a is deposited on silicon oxide layer 12a to a thickness of 500 Å using a low pressure chemical vapor deposition (LPCVD) method.

Figure 3B:
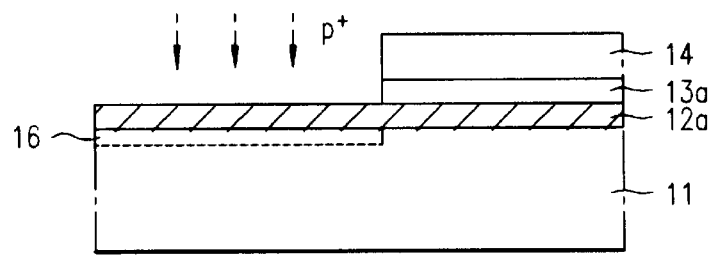

Referring to FIG. 3B, a portion of silicon nitride layer 13a corresponding to a potential n-well is removed and a first photoresist 14 is deposited on the remaining portion of silicon nitride layer 13a. Phosphorus ions ($P^+$) are implanted to the potential n-well portion at a dose of about $1.0 \times 10^{13}$ with an energy of 120 KeV.

Figure 3C:
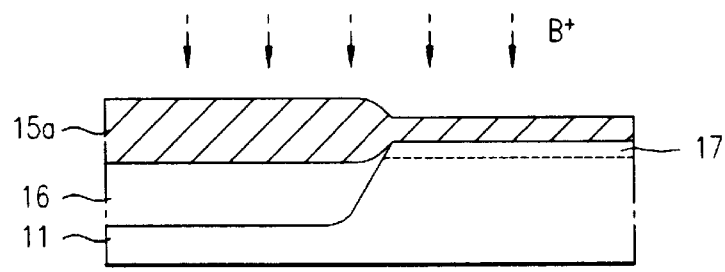

Referring to FIG. 3C, first photoresist 14 is removed and oxidized under an $H_2/O_2$ atmosphere at 1,000° C. using thermal oxidation to form a field oxide 15a, and is driven-in for 3 hours to form an n-well 16 within silicon substrate 11. Thereafter, silicon nitride layer 13a is removed and boron ions ($B^+$) are implanted into the potential p-well portion 17 at a dose of about $5.0 \times 10^{12}$ with an energy of 50 KeV.

Figure 3D:
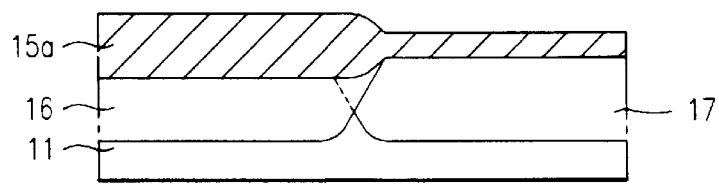

The p-well 17 is driven-in using a nitrogen ($N_2$) atmosphere at 1,000° C. for 4 hours, as shown in FIG. 3D.

Figure 3E:
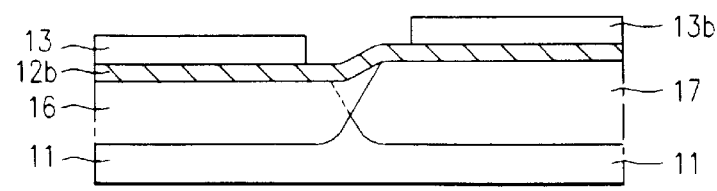

Referring to FIG. 3E, silicon oxide layers 12a and 15a are completely removed by dipping them into hydrogen fluoride (HF). Thereafter, thermal oxidation layer 12b is cultivated to a thickness of 100 Å in order to perform an insulation process with respect to active and field regions. Next, silicon nitride layer 13b is deposited to a thickness of 1,400 Å using the LPCVD method with the potential field oxide region 15b (see FIG. 3F) excluded. Subsequently, an active patterning is performed using photolithography.

Figure 3F:
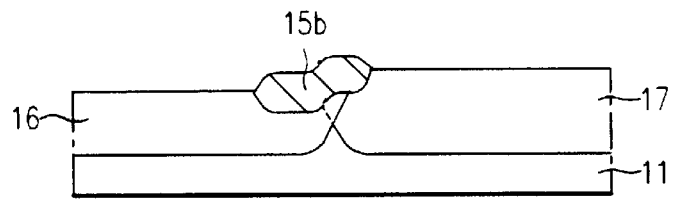

In order to perform a local oxidation of silicon (LOCOS) process, oxidation is performed under an $H_2/O_2$ atmosphere at 1,000° C. to form a 5,000 Å thick oxide layer of field oxide region 15b, as shown in FIG. 3F. Silicon nitride 13b is dipped into phosphoric acid ($H_3PO_4$) to be removed, and thermal oxidation layer 12b is dipped into hydrogen fluoride (HF) to be removed.

Figure 3G:
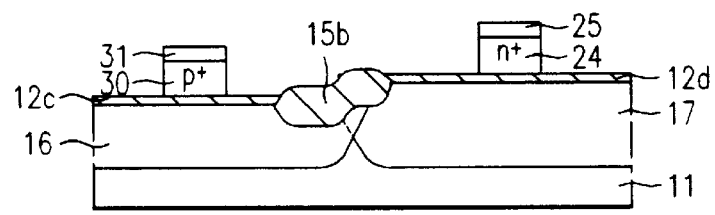

Referring to FIG. 3G, silicon oxide layer (initial oxide layer) 12c is cultivated to a thickness of 100 Å as a gate insulator and then $p^+$ type polysilicon electrode 30 is formed on initial oxide layer 12c at a middle portion of n-well 16 as a gate electrode. Also, initial oxide layer 12d is cultivated to a thickness of 100 Å as a gate insulator and then $n^+$ type polysilicon electrode 24 is formed on initial oxide layer 12d at a middle portion of p-well 17 as a gate electrode. At this time, the thickness of electrodes are made to be 2,000 Å. Silicon oxides ($SiO_2$) 31 and 25 are formed on $p^+$ and $n^+$ gate electrodes 30 and 24, respectively.

Figure 3H:
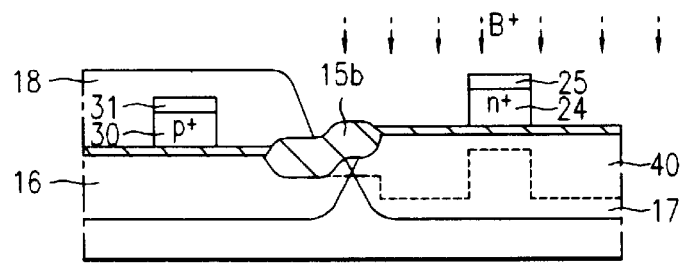

Referring to FIG. 3H, a second photoresist 18 is deposited on the PMOS region with the NMOS region exposed, and boron dopants ($B^+$) are ion-implanted at a concentration of $3.5 \times 10^{12}$ ions/cm$^2$ and with an energy of 150 KeV. At this time, optimum ion implantation conditions are set in view of (1) a threshold voltage of a device, (2) source/drain punch-through, and (3) field channel stop operation.

Figure 3I:
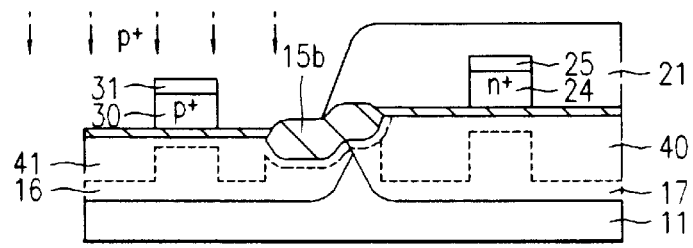
Figure 3J:
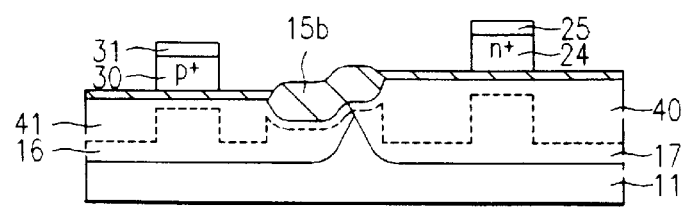

Referring to FIG. 3I, a third photoresist 21 is deposited on the NMOS region with the PMOS region exposed, and phosphorus dopants ($P^+$) are ion-implanted at a concentration of $3.5 \times 10^{12}$ ions/cm$^2$ and with an energy of 150 KeV. At this time, an ion implantation for controlling a threshold voltage of a device, an ion implantation for improving punch-through and latch-up characteristics of device, and a field channel stop ion implantation are performed simultaneously. Then, the third photoresist 21 is completely removed, as shown in FIG. 3J.

Figure 3K:
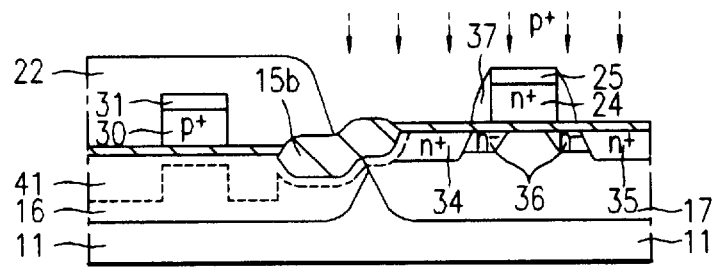

A fourth photoresist 22 is deposited on n-well 16, and phosphorus ions (P$^+$) are implanted on the p-well 17 to form an n$^-$ region 36, as shown in FIG. 3K. Side spacers 37 are formed on both sides of gate electrode 24 and silicon oxide 25. Then, phosphorus ions of a high concentration are implanted to form n$^+$ source 34 and n$^+$ drain 35. This is a lightly doped drain (LDD) structured.

Figure 3L:
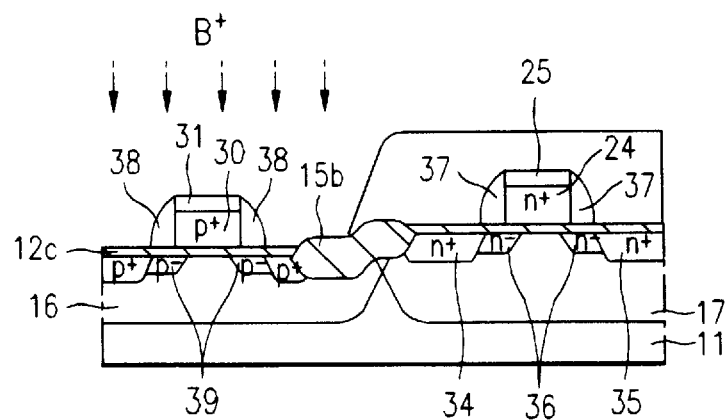
Figure 3M:
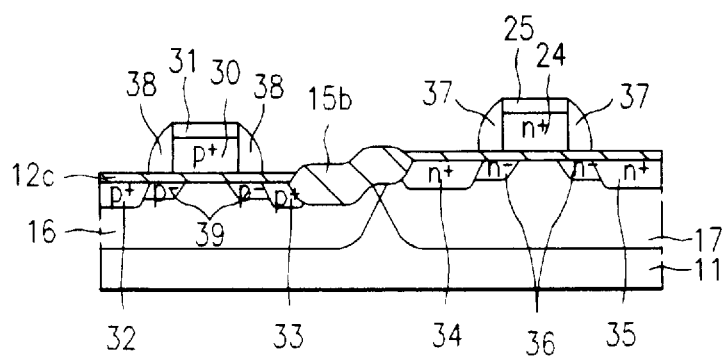

Referring to FIG. 3L, fourth photoresist 22 is removed, and a fifth photoresist 23 is deposited on p-well 17. Boron ions (B$^+$) are implanted to form a p$^-$ region 39. Side spacers 38 are formed on both sides of gate electrode 30 and silicon oxide 31. Then, boron ions of a high concentration are implanted to form p$^+$ source 32 and p$^+$ drain 33. This is also a lightly doped drain (LDD) structure. Then, the fifth photoresist 23 is completely removed to obtain a desired CMOS, as shown in FIG. 3M.

Figure 4:
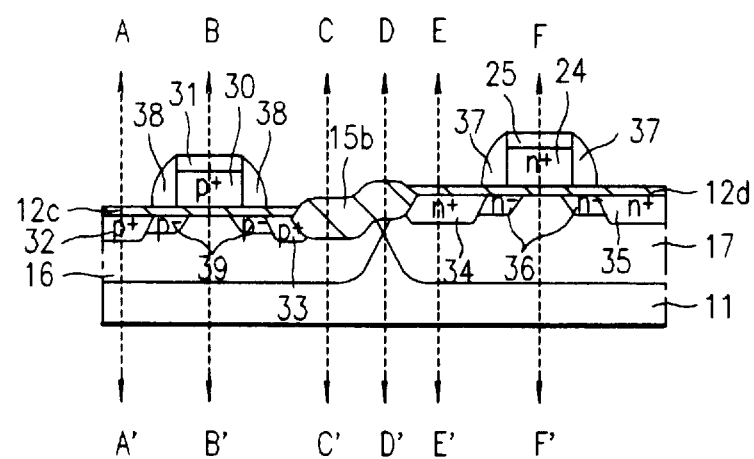
FIG. 4 is a cross-sectional view of a CMOS device according to the present invention.

FIG. 4 is a cross-sectional view of a completed CMOS device according to the present invention.

Figure 5A:
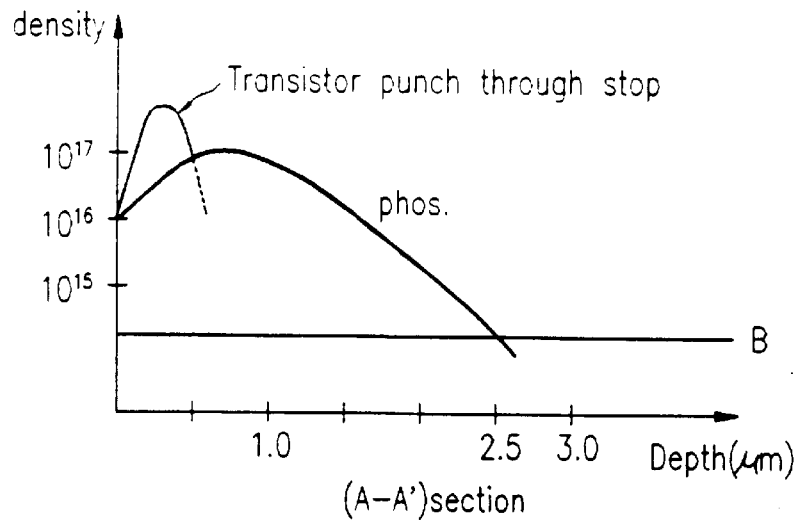
FIGS. 5A through 5C are doping profiles for various cross-sectional views of the CMOS device according to the present invention.
Figure 5B:
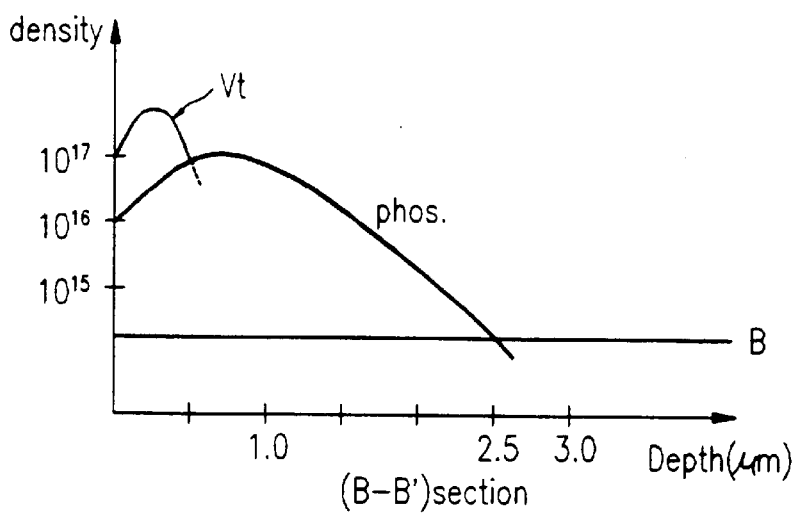
Figure 5C:
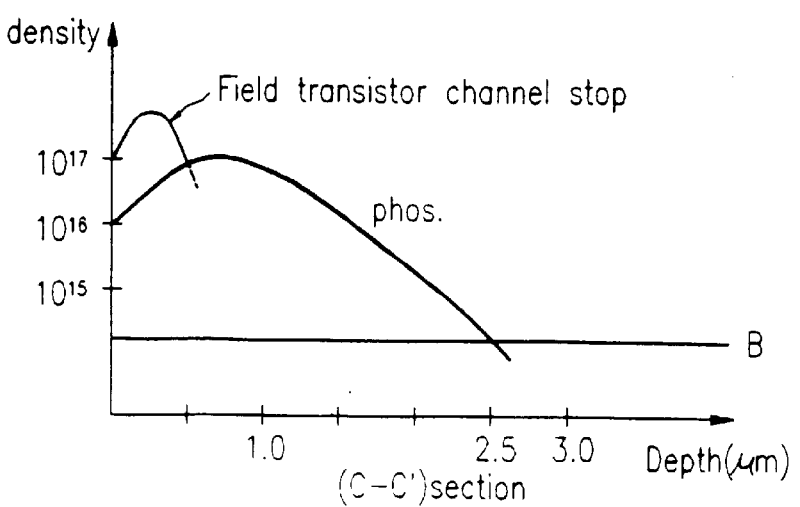

FIGS. 5A through 5C are doping profiles showing important cross-sectional views of a CMOS device shown in FIG. 4 according to the present invention. Specifically, FIG. 5A shows the prevention of a punch-through by a high doping concentration, FIG. 5B shows that a threshold voltage $V_t$ can be controlled by a high doping concentration at the device surface, and FIG. 5C shows that a field transistor channel stop operation can be facilitated. Also, an n-channel MOSFET region, i.e., p-well region, has similar doping profiles except that the impurity type is changed from phosphorus to boron.

As described above, according to the present invention, an ion implantation for controlling a threshold voltage of an operating device, an ion implantation for improving punch-through, and a field channel stop ion implantation are performed by a single ion implantation process at the same time, thereby simplifying the ion implantation process. The punch-through stop operation is performed only with respect to source and drain regions, thereby preventing characteristics such as reduced speed, reduced mobility, and increased junction capacitance which result from highly concentrated CMOS channel regions. In the case of a surface channel PMOS of a p$^+$ polysilicon gate, boron ions are automatically doped into the channel from the gate via a gate oxide, thereby varying the threshold voltage of CMOS. However, in the present invention, after forming a gate electrode, phosphorus ions are implanted to control the threshold voltage, so that the threshold voltage of CMOS does not vary. Also, since the well is retrograde-doped at high energy, latch-up characteristics of the CMOS are improved. In order to improve the device characteristics and since necessary portions are selectively doped without increasing the overall concentration of the well, a body effect problem can be solved due to the increased well concentration.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A CMOS fabrication method comprising the steps of:
    providing a substrate having a surface;
    forming a first conductive well adjacent to the surface of the substrate;
    forming a second conductive well adjacent to the surface of the substrate, a portion of the first conductive well overlapping a portion of the second conductive well;
    forming a field oxide in the overlapping portion of the first and second conductive wells;
    forming a first gate over the first conductive well and a second gate over the second conductive well;
    masking the first conductive well and implanting second conductive impurities on the second conductive well; and
    masking the second conductive well and implanting first conductive impurities on the first conductive well.

2. The CMOS fabrication method of claim 1, wherein the substrate is formed of silicon.

3. The CMOS fabrication method of claim 1, wherein the gate is formed of a metal.

4. The CMOS fabrication method of claim 1, wherein the gate is formed of a polysilicon.

5. The CMOS fabrication method of claim 1, wherein the step of implating the second conductive impurities controls a channel threshold voltage and a channel stop.

6. The CMOS fabrication method of claim 1, wherein the step of implanting the second conductive impurities includes the step of implanting boron ions.

7. The CMOS fabrication method of claim 6, wherein the boron ions are implanted at approximately $3.5 \times 10^{12}$ ions/cm$^2$ with an energy of approximately 150 KeV.

8. The CMOS fabrication method of claim 1, wherein the step of implanting the first conductive impurities controls a channel threshold voltage and a channel stop.

9. The CMOS fabrication method of claim 1, wherein the step of implanting the first conductive impurities includes the step of implanting phosphorus ions to the first conductive well.

10. The CMOS fabrication method of claim 9, wherein the boron ions are implanted at approximately $3.0 \times 10^{12}$ ions/cm$^2$ with an energy of approximately 150 KeV.

11. A CMOS fabrication method comprising the steps of:
    providing a substrate having a surface;
    forming a first conductive well adjacent to the surface of the substrate;
    forming a second conductive well adjacent to the surface of the substrate, a portion of the first conductive well overlapping a portion of the second conductive;
    forming a field oxide in the overlapping portion;
    forming a first gate over the first conductive well and a second gate over the second conductive well;
    selectively implanting second conductive impurities into the second conductive well; and
    selectively implanting first conductive impurities into the first conductive well.

12. The CMOS fabrication method of claim 11, wherein the substrate is formed of silicon.

13. The CMOS fabrication method of claim 7, wherein the gate is formed of a metal.

14. The CMOS fabrication method of claim 11, wherein the gate is formed of polysilicon.

15. The CMOS fabrication method of claim 11, wherein the step of selectively implanting the second conductive impurities controls a threshold voltage and a channel stop.

16. The CMOS fabrication method of claim 11, wherein the step of selectively implanting the second conductive impurities includes the step of implanting boron ions.

17. The CMOS fabrication method of claim 16, wherein the boron ions are implanted at approximately $3.5 \times 10^{12}$ ions/cm$^2$ with an energy of approximately 150 KeV.

18. The CMOS fabrication method of claim 11, wherein the step of selectively implanting the first conductive impurities controls a threshold voltage and a channel stop.

19. The CMOS fabrication method of claim 11, wherein the step of selectively implanting the first conductive impurities includes the step of implanting phosphorus ions.

20. The CMOS fabrication method of claim 19, wherein the phosphorus ions are implanted at substantially $3.0 \times 10^{12}$ ions/cm$^2$ with an energy of approximately 150 KeV.

* * * * *